(12) United States Patent
Kerr et al.

(10) Patent No.: US 8,718,572 B2
(45) Date of Patent: May 6, 2014

(54) RECONFIGURABLE RF SWITCH DIE

(75) Inventors: Daniel Charles Kerr, Oak Ridge, NC (US); Ali Tombak, High Point, NC (US); Christian Rye Iversen, Vestbjerg (DK)

(73) Assignee: RF Micro Devices, Inc., Greensboro, NC (US)

(*) Notice: Subject to any disclaimer, the term of this patent is extended or adjusted under 35 U.S.C. 154(b) by 320 days.

(21) Appl. No.: 12/961,039

(22) Filed: Dec. 6, 2010

(65) Prior Publication Data

US 2012/0139363 A1 Jun. 7, 2012

(51) Int. Cl.
*H04B 1/44* (2006.01)

(52) U.S. Cl.
USPC .......................................................... 455/78

(58) Field of Classification Search
USPC .......... 455/78, 80, 82, 83; 257/666, 674, 676, 257/347
See application file for complete search history.

(56) References Cited

U.S. PATENT DOCUMENTS

| 2007/0090496 A1* | 4/2007 | Otremba ........................ 257/666 |
| 2008/0117894 A1* | 5/2008 | McMorrow ................... 370/359 |
| 2008/0203478 A1* | 8/2008 | Prikhodko et al. ............ 257/347 |

* cited by examiner

*Primary Examiner* — April G Gonzales
(74) *Attorney, Agent, or Firm* — Withrow & Terranova, P.L.L.C.

(57) ABSTRACT

A radio frequency (RF) switch die which includes an antenna port, a plurality of RF ports, a switch fabric for selectively coupling one or more of the RF ports to the antenna port, and control circuitry that is adapted to, in a first mode, direct the switch fabric to couple any one of the plurality of RF ports individually to the antenna port, and in a second mode, couple a selected group of the RF ports to the antenna port. The RF switch die may include M number of RF ports, and be relatively easily reconfigured to provide N number of RF ports, wherein N is less than M. Groups of RF ports may be coupled together to form coupled RF ports that offer different electrical characteristics than non-coupled RF ports.

18 Claims, 7 Drawing Sheets

RECONFIGURABLE RF SWITCH DIE

FIELD OF THE DISCLOSURE

The subject matter of the disclosure relates generally to a radio frequency (RF) switch die, and in particular to an RF switch die which can, in one mode, selectively couple any individual RF port to an antenna port, and in a second mode, selectively couple a group of RF ports to the antenna port.

BACKGROUND

The design and manufacture of a radio frequency (RF) switch die for a particular RF application is time-consuming and requires a substantial investment of resources. A new RF switch die can involve designing and testing a custom RF die layout, a custom integrated controller with a new truth table, and a custom mask set, among other things. While ideally an RF switch die can be used in multiple different applications, frequently a customer's requirements differ from the specifications of an existing RF switch die. For example, a customer's specifications may require a particular number of RF ports that differs from the number of RF ports on an existing RF switch die; a particular location of one or more RF ports; and/or RF ports at certain locations that have different electrical characteristics, such as different insertion loss characteristics. In such circumstances, it is typically necessary to design and test a new custom RF die which meets the customer's specifications, which requires the substantial investment in resources discussed above. Accordingly, what is needed is an RF switch die which can be reconfigured to fit multiple different applications, eliminating the need to design and test a new RF switch die. Such a reconfigurable RF switch die would enable an RF switch die manufacturer to build up inventory of RF switch dies, and reconfigure existing RF switch dies to meet new requirements. This would substantially reduce costs, including time, involved in designing and testing a new RF switch die.

SUMMARY

Embodiments disclosed herein relate to a reconfigurable radio frequency (RF) switch die. The RF switch die includes an antenna port adapted to be coupled to an antenna, and a plurality of RF ports. The RF switch die includes a switch fabric which selectively couples one or more of the RF ports to the antenna port in response to a control signal. The switch fabric is directed by control circuitry that is adapted to couple any one of the RF ports individually to an antenna port or to couple a selected group of the RF ports to the antenna port in response to the control signal.

The control circuitry may include, or be coupled to, a truth table that includes a plurality of different control values. Some of the control values correspond to different ones of the RF ports, and some of the control values correspond to groups of the RF ports. The control circuitry selectively couples one of the RF ports to the antenna lead, or a group of the RF ports to the antenna lead, based on the control value contained in the control signal.

The RF switch die may be relatively easily reconfigured to provide a smaller number of RF ports to meet a desired specification. In particular, a group of RF ports on the RF switch may be electrically coupled together to form a coupled RF port. Electrical characteristics, such as insertion loss characteristics, of the coupled RF port may be different from those of a non-coupled RF port due to the existence of multiple paths from the coupled RF port to the antenna port. The coupled RF port may be formed at a desired location on the RF switch in accordance with a customer's specifications. Because the truth table includes a control value that corresponds to the group of RF ports, the RF switch controller can selectively switch the group of RF ports in the coupled RF port to the antenna port in response to receipt of the control value.

The group of RF ports may be electrically coupled together by any of multiple different mechanisms. In one embodiment, the RF switch die may comprise a flip chip. A substrate, such as a laminate, is provided that has a metal pad which, when bonded to the RF switch die, forms a coupled RF port by electrically coupling together the group of RF ports. The laminate provides a conductive path from the coupled RF port to circuitry, such as receive or transmit circuitry, which receives or sends an RF signal via the coupled RF port. In another embodiment, the group of RF ports may be electrically coupled together via one or more wire bonds.

In one embodiment, a method is provided for providing an RF switch assembly with a desired number of assembly RF ports, such as N number of RF ports. The method includes providing an RF switch die that includes an antenna port; M number of RF ports, where M is greater than N; a switch fabric for selectively coupling one or more of the M number of RF ports to the antenna port; and control circuitry that is adapted, in a first mode, to direct the switch fabric to couple any one of the M number of RF ports individually to the antenna port or, in a second mode, to couple a first selected group of the RF ports to the antenna port. A substrate is provided that has N number of pads, each of the N number of pads electrically coupled to a different RF assembly port, and a first pad of the plurality of pads configured to, when bonded in a first orientation with the RF switch die, electrically couple the first selected group of RF ports together to form a coupled RF port. The substrate is bonded to the RF switch die in the first orientation forming the RF switch assembly comprising N number of RF ports.

The coupled RF port may be selectively coupled via the switch fabric to receive circuitry, for example. Upon receiving the designated control signal, the control circuitry couples each of the RF ports in the coupled RF port to the antenna port, and an RF signal received at the antenna port is provided to the receive circuitry via each RF port in a first selected group of RF ports.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
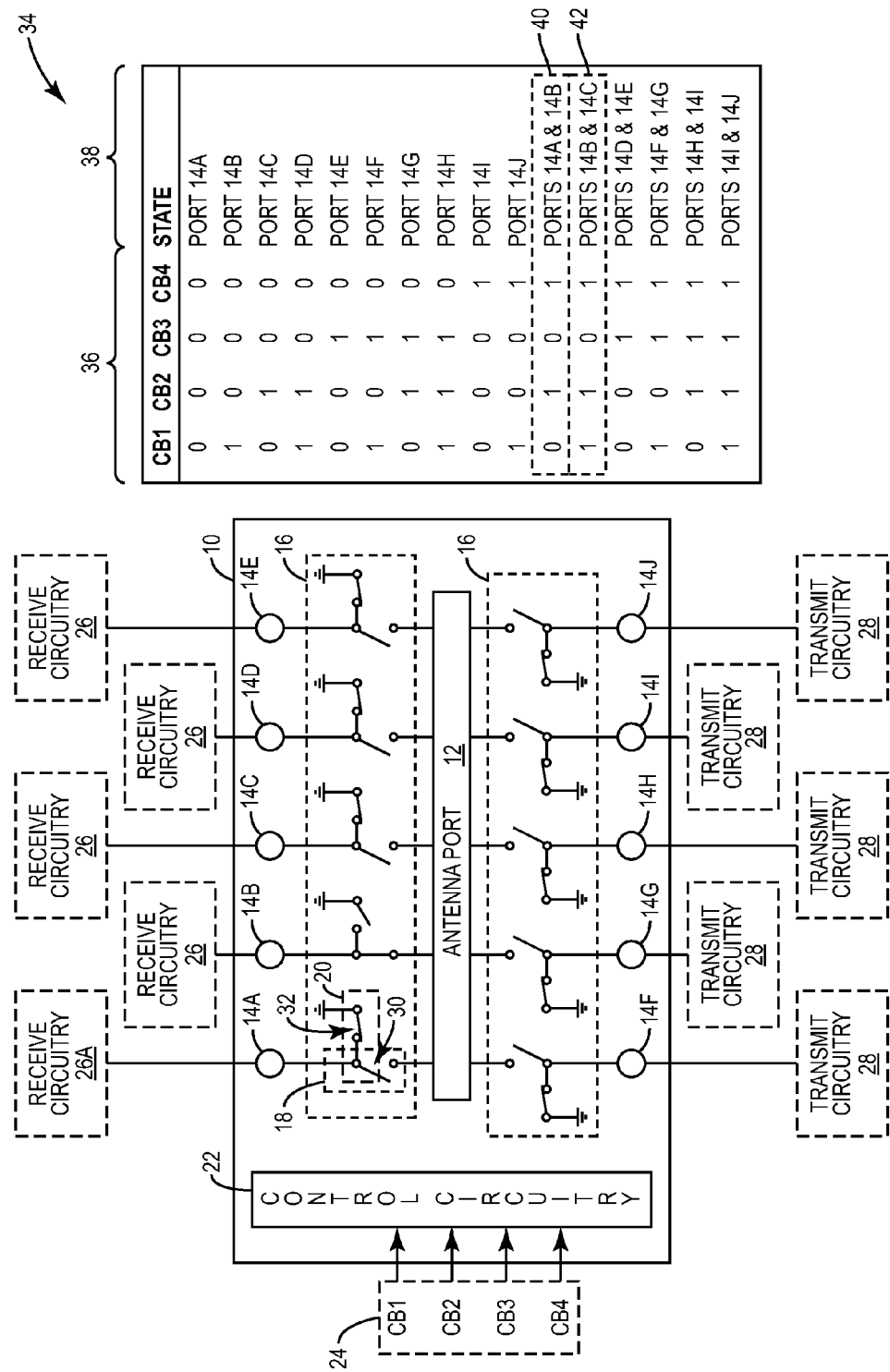
FIG. 1 is a schematic diagram of a radio frequency (RF) switch die according to one embodiment.

FIG. 1 is a schematic diagram of a radio frequency (RF) switch die 10 according to one embodiment. The RF switch die 10 includes an antenna port 12 and a plurality of RF ports 14A-14J (generally, RF port 14 or RF ports 14). While embodiments will be discussed herein with reference to an RF switch die with 10 RF ports, the present disclosure is applicable to RF switch dies with any number of RF ports. Further, while embodiments will be discussed with reference to a single pole multiple throw RF switch, the present disclosure is applicable to other switch architectures, such as, for example, multiple pole, multiple throw switch architectures.

The RF switch die 10 includes a switch fabric 16 that selectively couples one or more of the RF ports 14 to the antenna port 12. The switch fabric 16 may comprise any suitable semiconductor switches, such as field effect transistors or the like. Switching circuitry in the switch fabric 16 for selectively coupling an RF port 14, such as the RF port 14A, to the antenna port 12 may include, for example, a series branch 18 and a shunt branch 20. Control circuitry 22 is adapted to, in a first mode, direct the switch fabric 16 to couple any one of the RF ports 14 to the antenna port 12 in response to a control signal 24, and, in a second mode, to couple a first selected group of RF ports 14 to the antenna port 12. The control signal 24 may comprise, for example, a general purpose input/output (GPIO) control signal, a MIPI control signal, or any other control signal suitable for use by RF switch control circuitry.

When assembled on a printed circuit board, each of the RF ports 14 may be electrically coupled, via metal traces or other electrical connections, to receive circuitry 26A, 26 (generally, receive circuitry 26) or transmit circuitry 28. To connect the RF port 14A to the antenna port 12, for example, the control circuitry 22 closes a series switch 30, and opens a shunt switch 32. RF signals received at the antenna port 12 travel via the series branch 18 to the receive circuitry 26A. To decouple the RF port 14A from the antenna port 12, the control circuitry 22 opens the series switch 30, and closes the shunt switch 32. Any RF signals received at the antenna port 12 are shunted to ground via the shunt branch 20, increasing isolation between the receive circuitry 26A and the antenna port 12.

The RF switch die 10 includes logic, represented in the form of a truth table 34, which is used by the control circuitry 22 to direct the switch fabric 16 to selectively couple any one of the RF ports 14 to the antenna port 12, or to couple first selected group of RF ports 14 to the antenna port 12. In particular, the truth table 34 comprises a plurality of control values, as illustrated in control value column 36 of the truth table 34, each of which corresponds to a particular RF port 14, or group of the RF ports 14, as illustrated in state column 38. To couple a desired RF port 14, or group of RF ports 14, to the antenna port 12, the control signal 24 contains the control value from the control value column 36 which corresponds to the desired RF port 14, or group of RF ports 14, identified in the state column 38.

The RF switch die 10 disclosed herein may not only be used in applications that require separate use of each of the RF ports 14, but may also be used in RF switching applications that require fewer than the number of RF ports 14. For example, assume the number of the RF ports 14 (i.e., in the example illustrated in FIG. 1, 10 RF ports 14) is referred to by the letter M. Thus, in this example, the letter M represents 10 RF ports 14. A customer may have a requirement for an RF switch assembly that contains 8 RF ports 14. This may be referred to as N number of RF ports. The RF switch die 10 may be reconfigured to provide N number (or other numbers of the RF ports 14 equal to or less than M) of the RF ports 14. Consequently, the truth table 34 includes control values which, when encoded in the control signal 24, cause the control circuitry 22 to couple a selected group of RF ports 14 to the antenna port 12. For example, entry 40 of the truth table 34 contains a control value that causes the control circuitry to direct the switch fabric 16 to selectively couple both the RF port 14A and RF port 14B simultaneously to the antenna port 12. Entry 42 of the truth table 34 contains a control value that causes the control circuitry to direct the switch fabric 16 to selectively couple both the RF port 14B and RF port 14C simultaneously to the antenna port 12.

Figure 2:
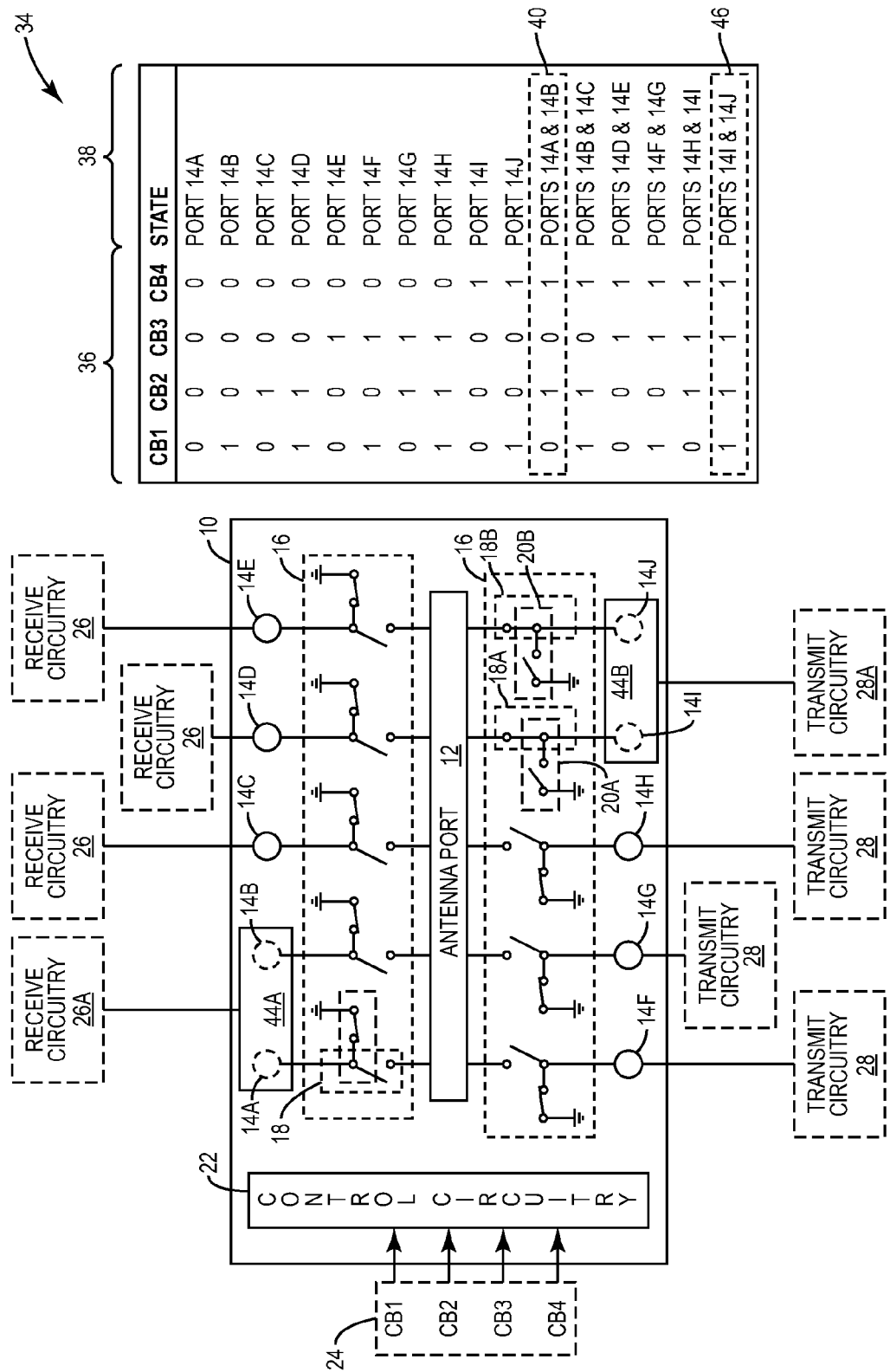
FIG. 2 is a schematic diagram of the RF switch die illustrated in FIG. 1, which has been reconfigured to provide N number of RF ports, wherein N is 8.

FIG. 2 is a schematic diagram of the RF switch die 10 which has been reconfigured to provide N number of RF ports, wherein N is 8. In particular, the two RF ports 14A and 14B have been electrically coupled together to form a coupled RF port 44A (generally, coupled port 44 or coupled ports 44). Similarly, the two RF ports 14I and 14J have been electrically coupled together to form a coupled RF port 44B. The coupled RF port 44A is electrically coupled to the receive circuitry 26A, and the coupled RF port 44B is electrically coupled to the transmit circuitry 28A. To couple the transmit circuitry 28 to the antenna port 12, the control signal 24 is encoded with the control value from entry 46 (i.e., x'1111') of the truth table 34. Upon receipt of the control signal 24, the control circuitry 22 directs the switch fabric 16 to couple RF ports 14I and 14J simultaneously to the antenna port 12. Signals transmitted by the transmit circuitry 28A arrive at the coupled RF port 44B and travel down both series branches 18A, 18B to the antenna port 12.

Advantageously, as discussed in greater detail below with regard to FIG. 8, the coupled RF port 44B may have a significantly lower insertion loss characteristic than non-coupled RF ports 14. The RF switch die 10 may therefore be configured to offer RF ports that have different electrical characteristics at different locations with respect to the RF switch die 10 by forming one or more coupled ports 44 at desired locations. Because the truth table 34 contains control values that enable any one of the RF ports 14 to be selectively coupled to the antenna port 12, or selected groups of the RF ports 14 to be selectively coupled to the antenna port 12, the RF switch die 10 can be reconfigured in a number of different configurations in response to particular specifications, eliminating the need to redesign and retest the RF switch die 10.

Moreover, this flexibility enables a manufacturer of the RF switch die 10 to build up an inventory of the RF switch dies 10 which can subsequently be reconfigured for a particular RF switch application.

Figure 3:
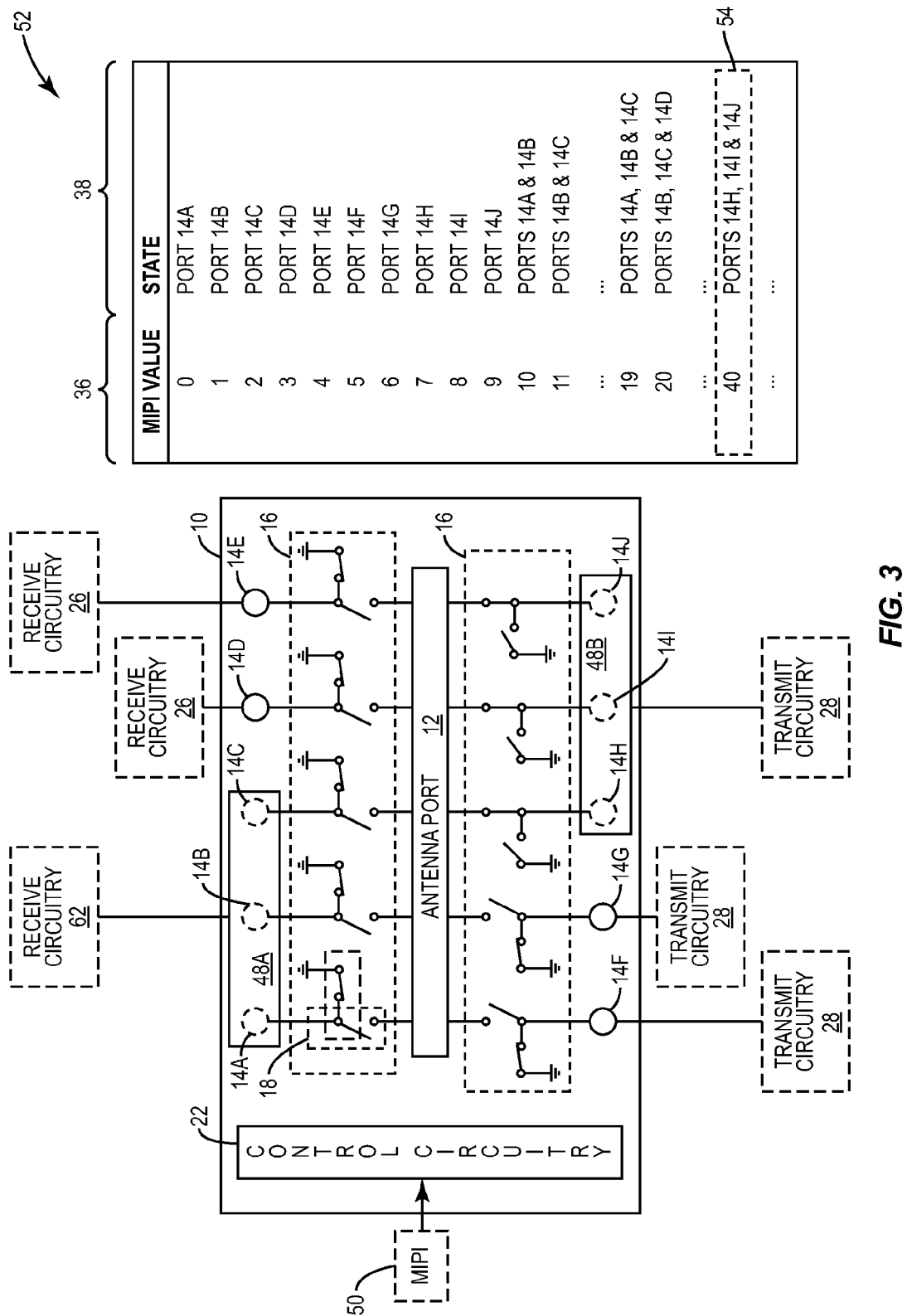
FIG. 3 is a schematic diagram of the RF switch die illustrated in FIG. 1, which has been reconfigured to provide N number of RF ports, wherein N is 6.

FIG. 3 is a schematic diagram of the RF switch die 10 which has been reconfigured to provide N number of RF ports, wherein N is 6 RF ports. In this example, the RF ports 14A-14C have been electrically coupled together to form a coupled RF port 48A, and the RF ports 14H-14J have been electrically coupled together to form a coupled RF port 48B. In this embodiment, a MIPI control signal 50 is used to control the switch fabric 16. A MIPI control signal is typically an 8-bit control signal, and thus truth table 52 may contain up to 256 entries, each of which may contain a control value that corresponds to an RF port 14, or a group of RF ports 14. Because there may be up to 256 entries, the truth table 52 may contain a control value for practically any possible combination of RF ports 14 which may ultimately be used to form a coupled RF port. For example, entry 54 contains a control value which corresponds to the RF ports 14H-14J, which form the coupled RF port 48B. Upon receipt of the MIPI control signal 50 encoded with the control value 40, the control circuitry 22 directs the switch fabric 16 to couple the RF ports 14H-14J simultaneously to the antenna port 12.

Figure 4:
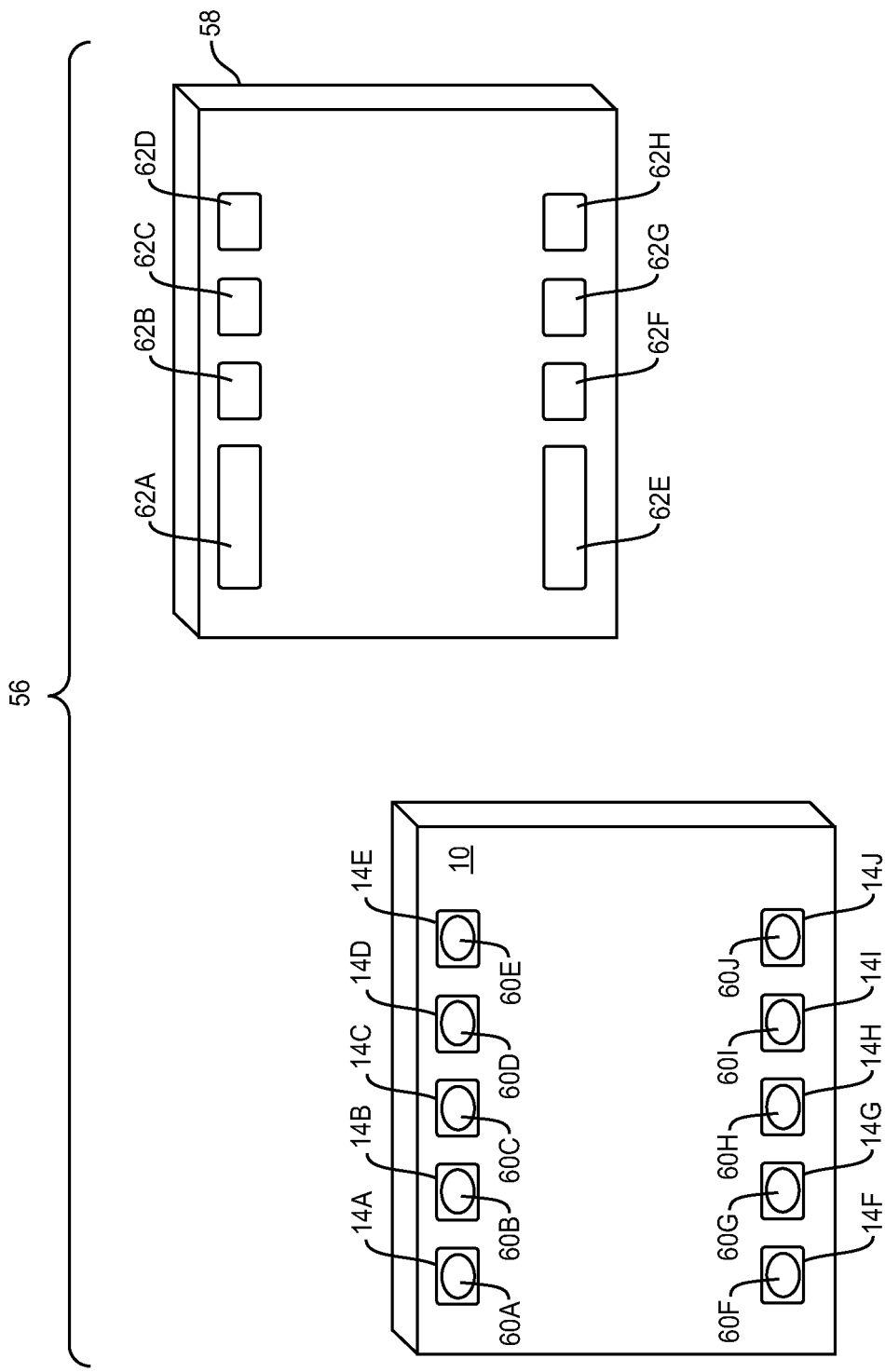
FIG. 4 is an exemplary block diagram illustrating components of an RF switch assembly.

FIG. 4 is a block diagram illustrating components of an RF switch assembly 56. The RF switch assembly 56 includes the RF switch die 10 and a substrate 58. Assume that, as illustrated in FIGS. 1-3, the RF switch die 10 has 10 RF ports 14A-14H. Assume further that an RF switch assembly 56 offering 8 RF ports is required. In this embodiment, the RF switch die 10 comprises a flip chip configuration, and each of the RF ports 14 is electrically coupled to a corresponding conductive bump 60A-60J (generally, conductive bump 60 or conductive bumps 60). Based on the requirement for 8 RF ports, the substrate 58 has 8 contacts 62A-62H (generally, contact 62 or contacts 62) which, when bonded in a particular orientation with respect to the RF switch die 10, are electrically coupled to one or more of the RF ports 14. The contacts 62 may comprise, for example, metal pads, which, when bonded with corresponding conductive bumps 60, provide signal paths to and/or from the RF ports 14 to RF nodes on the substrate 58 (see FIG. 5). While the discussion regarding FIG. 4 illustrates a flip chip configuration of the RF switch die 10, embodiments disclosed herein are not limited to flip chip configurations. The RF switch die 10 may also comprise a non-flip chip configuration, and coupled RF ports may be formed by using wire bonds to electrically couple a group of RF ports 14 together.

Figure 5:
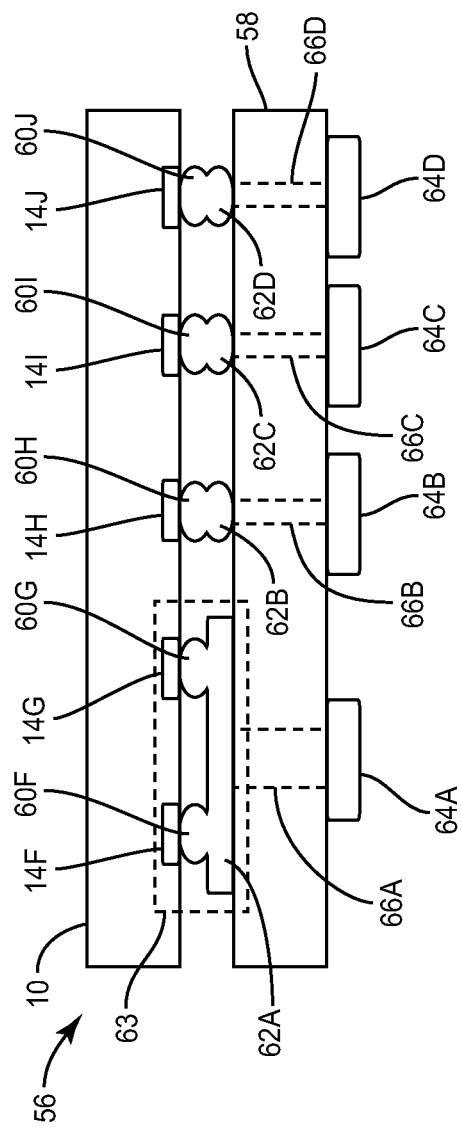
FIG. 5 is a block diagram illustrating a side view of the RF switch assembly illustrated in FIG. 4 after the RF switch die has been bonded to a substrate.

FIG. 5 is a block diagram illustrating a side view of the RF switch assembly 56 illustrated in FIG. 4 after the RF switch die 10 has been bonded to the substrate 58. When bonded together, the contact 62A electrically couples a group of RF ports, in particular the RF ports 14F and 14G, together, to form a coupled RF port 63. The contact 62A may be coupled to an RF node 64 by a via or conductive path 66A. Contacts 62B, 62C, and 62D similarly provide electrical paths between corresponding RF ports 14H, 14I, and 14J to RF nodes 64B, 64C, and 64D through vias or conductive paths 66B, 66C, and 66D. Similarly, the contact 62E (not shown) may couple together the RF ports 14A and 14B to form a coupled RF port 63, and the contacts 62F, 62G, and 62H be coupled to RF ports 14C, 14D, and 14E respectively (not shown). In this manner, the RF switch assembly 56 offers 8 RF nodes 64 (i.e., RF ports), each of which may be coupled to circuitry, such as the receive circuitry 26 or the transmit circuitry 28 (FIG. 3).

Figure 6:
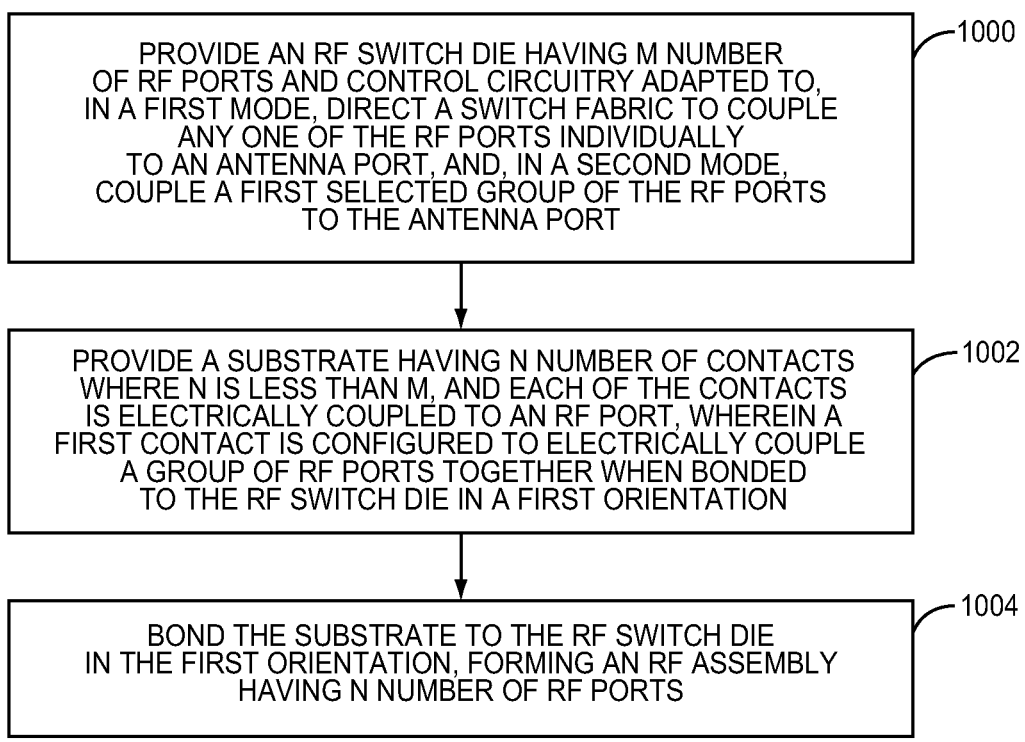
FIG. 6 is a flowchart of a process for reconfiguring the RF switch die according to one embodiment.

The embodiments herein enable a manufacturer to build up a supply of the RF switch dies 10, and reconfigure existing RF switch dies 10 to provide an RF switch assembly 56 that meets the requirements of a desired RF switch. FIG. 6 is a flowchart of a process for reconfiguring the RF switch die 10 according to one embodiment. FIG. 6 will be discussed in conjunction with FIGS. 1, 4, and 5. Assume that the RF switch die 10, as discussed with regard to FIG. 4, has 10 RF ports 14. The number 10 will be referred to as M, and M could represent any number of RF ports 14, although in this example it represents 10 RF ports 14. The RF switch die 10 includes control circuitry 22 (FIG. 1) that is adapted to, in a first mode, direct the switch fabric 16 to couple any one of the RF ports 14 to the antenna port 12 in response to a control signal 24, and, in a second mode, couple a first selected group of RF ports 14 to the antenna port 12 (step 1000).

It is determined that an RF switch assembly 56 is desired with 8 RF ports. The number 8 will be referred to as N, and N could represent any number of RF ports that is equal to or less than M. The substrate 58 is provided with 8 contacts, in a configuration such that when the substrate 58 is bonded to the RF switch die 10 in a first orientation, a first contact electrically couples two of the RF ports 14 together to form a coupled RF port, and a second contact electrically couples two others of the RF ports 14 together to form a second coupled RF port (step 1002). The RF switch die 10 is then bonded to the substrate 58, forming an RF switch die 10 with 8 RF ports (step 1004).

Figure 7:
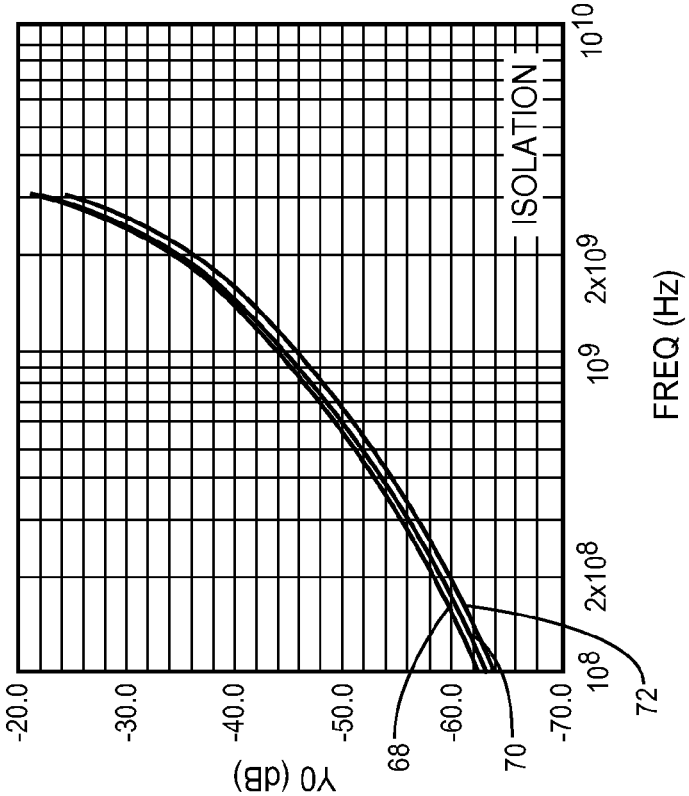
FIG. 7 is a graph illustrating isolation characteristics of coupled RF ports compared to non-coupled RF ports in an exemplary single pole ten throw RF switch.

FIG. 7 is a graph illustrating isolation characteristics of coupled RF ports compared to non-coupled RF ports 14 in an exemplary single pole ten throw RF switch die 10. Curves 68, 70, and 72 illustrate the isolation in decibels (dB) of a single RF port 14, a coupled RF port comprising two RF ports 14 coupled together, and a coupled RF port having three RF ports 14 coupled together. The width of the series branches 18 of the RF ports 14 are 3 mm, and the width of the shunt branches 20 are 1 mm. As illustrated, electrically coupling multiple RF ports 14 together to form a coupled RF port has a minimal effect on the isolation characteristics of the coupled RF ports compared to the non-coupled RF port 14. This is likely because although isolation may be expected to suffer as the cumulative width of the series branches 18 increases in a coupled RF port, the increased width of the corresponding shunt branches 20 compensates for such otherwise detrimental effect of the increased series branch width. One technical advantage of increasing the series branch width of the series branches 18 by coupling multiple RF ports 14 together via the substrate 58 is that associated bias circuitry, which is used to keep the resistive-capacitive (RC) delay of series branches 18 similar to one another while simultaneously limiting spurious noise transmitted to the switch from the controller circuit, and also maintaining the switch voltage stacking of the field effect transistors, need not be changed when the series branch width is increased by coupling multiple RF ports 14 together via the substrate 58.

Figure 8:
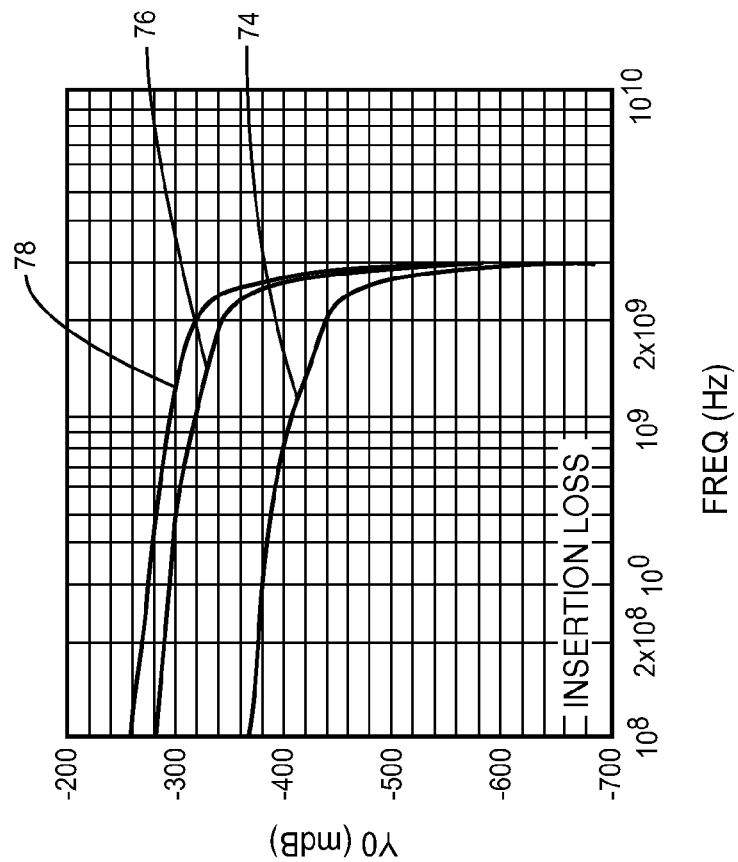
FIG. 8 is a graph illustrating how coupled RF ports compare to non-coupled RF ports in the exemplary single pole ten throw RF switch discussed in FIG. 7.

FIG. 8 is a graph illustrating how coupled RF ports compared to non-coupled RF ports 14 in the exemplary single pole ten throw RF switch die 10 discussed in FIG. 7. Curve 74 identifies the insertion loss associated with a non-coupled RF port 14 at relevant frequencies (Hz). Curve 76 identifies the substantially better insertion loss characteristics of a coupled RF port having two RF ports 14 coupled together compared to the non-coupled RF port 14 illustrated in the curve 74. In this example, the coupled RF port has an improvement of approximately 85 mdB. Curve 78 identifies the improvement in insertion loss characteristics of a coupled RF port having three RF ports 14. Curve 78 illustrates that a coupled RF port having three RF ports 14 coupled together offers approximately a 20 mdB improvement over a coupled RF port having two RF ports 14 coupled together, and a 105 mdB improvement over a non-coupled RF port 14.

Those skilled in the art will recognize improvements and modifications to the preferred embodiments of the present disclosure. All such improvements and modifications are considered within the scope of the concepts disclosed herein and the claims that follow.

What is claimed is:

1. An assembly, comprising:
    a radio frequency (RF) switch die, the RF switch die comprising:
        an antenna port;
        a plurality of RF ports;
        a switch fabric for selectively coupling one or more of the RF ports to the antenna port; and
        control circuitry adapted to, in a first mode, direct the switch fabric to couple any one of the plurality of RF ports individually to the antenna port, and in a second mode, couple a selected group of the RF ports to the antenna port.

2. The assembly of claim 1, wherein based on a control signal, the control circuitry is adapted to, in the first mode, direct the switch fabric to couple the any one of the plurality of RF ports individually to the antenna port, and in the second mode, couple the selected group of the RF ports to the antenna port.

3. The assembly of claim 2, wherein the control circuitry comprises a truth table comprising a plurality of different control values, wherein the plurality of different control values comprises a control value for each of the plurality of RF ports, and a control value for a plurality of groups of the RF ports, including the selected group.

4. The assembly of claim 3, wherein the control signal comprises one of the different control values, and wherein based on the one of the different control values, the control circuitry is adapted to, in the first mode, direct the switch fabric to couple the any one of the plurality of RF ports individually to the antenna port, and in the second mode, couple the selected group of RF ports to the antenna port.

5. The assembly of claim 3, further comprising a substrate bonded to the RF switch die, wherein the substrate comprises a first contact that electrically couples together the selected group of the RF ports to form a coupled RF port.

6. The assembly of claim 5, wherein the RF switch die comprises a flip chip, and the first contact comprises a metal pad that electrically couples together the selected group of the RF ports to form the coupled RF port.

7. The assembly of claim 5, further comprising receive circuitry coupled to the first contact, wherein when the selected group of the RF ports is coupled to the antenna port via the switch fabric, an RF signal received at the antenna port is carried toward the receive circuitry via each RF port in the selected group of the RF ports.

8. The assembly of claim 5, further comprising transmit circuitry coupled to a first node, wherein when the selected group of the RF ports is coupled to the antenna port via the switch fabric, an RF signal transmitted by the transmit circuitry is provided to the antenna port via each RF port in the first group of the RF ports.

9. The assembly of claim 2, further comprising one or more wire bonds that electrically couples together a plurality of the RF ports in the selected group of the RF ports to form a coupled RF port.

10. The assembly of claim 1, wherein the RF switch die comprises a single pole multiple throw RF switch die.

11. The assembly of claim 1, wherein the RF switch die comprises a multiple pole multiple throw RF switch die.

12. A method for providing a radio frequency (RF) switch assembly comprising a first plurality of RF ports comprising N number of the RF ports, comprising:
    providing an RF switch die comprising:
        an antenna port;
        a second plurality of RF ports comprising M number of RF ports, M being greater than N;
        a switch fabric for selectively coupling one or more of the second plurality of RF ports to the antenna port; and
        control circuitry adapted to, in a first mode, direct the switch fabric to couple any one of the second plurality of RF ports individually to the antenna port, and in a second mode, couple a selected group of the RF ports to the antenna port in response to a control signal;
    providing a substrate having a plurality of contacts comprising N number of contacts, each of the plurality of contacts electrically coupled to at least one of the RF ports of the first plurality of RF ports, a first contact of the plurality of contacts adapted to, when bonded in a first orientation with the RF switch die, electrically couple the selected group of the RF ports together; and
    bonding the substrate to the RF switch die in the first orientation.

13. The method of claim 12, wherein the substrate comprises a second contact of the plurality of contacts that is adapted to, when bonded in the first orientation with the RF switch die, electrically couple a second selected group of the RF ports together.

14. The method of claim 12, wherein the substrate further comprises a first RF node, and wherein the first contact is electrically coupled to the first RF node, and further comprising electrically coupling receive circuitry to the first RF node.

15. The method of claim 12, wherein the substrate further comprises a first RF node, and wherein the first contact is electrically coupled to the first RF node, and further comprising electrically coupling transmit circuitry to the first RF node.

16. The assembly of claim 13, wherein the substrate further comprises a first RF node and a second RF node, and wherein the first contact is electrically coupled to a first RF node, and the second contact is electrically coupled to a second RF node, and further comprising:
    electrically coupling receive circuitry to the first RF node; and
    electrically coupling transmit circuitry to the second RF node.

17. The method of claim 12, wherein the control circuitry comprises a truth table comprising a plurality of different control values, wherein the plurality of different control values comprises a control value for each of the first plurality of RF ports, and a control value for a plurality of groups of the RF ports, including the selected group.

18. The method of claim 12, wherein the RF switch die is provided from an inventory of RF switch dies, and wherein the substrate is manufactured to provide the first plurality of RF ports comprising N number of the RF ports based on the RF switch die.

* * * * *